United States Patent
Fujii

(10) Patent No.: US 9,258,049 B2
(45) Date of Patent: Feb. 9, 2016

(54) COMMUNICATION DEVICE AND ORIENTATION CONTROL METHOD

(71) Applicant: Samsung Electronics Co., Ltd., Gyeonggi-do (KR)

(72) Inventor: Masaaki Fujii, Kanagawa (JP)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 14/410,563

(22) PCT Filed: Jun. 21, 2013

(86) PCT No.: PCT/KR2013/005516
§ 371 (c)(1),
(2) Date: Dec. 22, 2014

(87) PCT Pub. No.: WO2013/191514
PCT Pub. Date: Dec. 27, 2013

(65) Prior Publication Data
US 2015/0326300 A1 Nov. 12, 2015

(30) Foreign Application Priority Data
Jun. 21, 2012 (JP) .................... 2012-140002

(51) Int. Cl.
*H03D 1/04* (2006.01)
*H04B 7/08* (2006.01)
(Continued)

(52) U.S. Cl.
CPC ............ *H04B 7/0802* (2013.01); *H04B 7/0865* (2013.01); *H04L 1/06* (2013.01);
(Continued)

(58) Field of Classification Search
CPC ..... H04L 27/2647; H03M 13/09; H04B 1/40; H04B 7/068; H04W 28/04

USPC ............... 375/267, 346; 455/63.1, 101, 114.2
See application file for complete search history.

(56) References Cited

U.S. PATENT DOCUMENTS

2002/0190901 A1* 12/2002 Yoshida ............... H04B 7/0851
342/383
2006/0121910 A1 6/2006 Willey et al.
(Continued)

FOREIGN PATENT DOCUMENTS

| JP | 2002-064322 | 2/2002 |
|----|-------------|--------|
| JP | 2008-205645 | 9/2008 |
| JP | 2011-109181 | 6/2011 |

OTHER PUBLICATIONS

International Search Report dated Oct. 11, 2013 in connection with International Patent Application No. PCT/KR2013/005516, 4 pages.

*Primary Examiner* — Leila Malek

(57) ABSTRACT

The communication device includes: a phased array antenna having a plurality of antenna elements arranged on a plane for receiving signals transmitted from one or more transmitting devices; a signal converter for combining signals received through antenna elements for each sub-array and converting the combined signal for each sub-array into a baseband signal, the each sub-array being grouped from the plurality of antenna elements; a signal processor for decoding playback data based on respective baseband signals for sub-arrays in each resource block and detecting an error of the decoded playback data; and an orientation controller for controlling orientation of the phased array antenna based on the base band signals for the sub-arrays and a signal of a resource block with the playback data having no error.

20 Claims, 10 Drawing Sheets

(51) Int. Cl.
    *H04L 1/06*    (2006.01)
    *H04L 25/08*   (2006.01)
    *H04L 5/00*    (2006.01)
    *H04B 1/40*    (2015.01)
    *H03M 13/09*   (2006.01)
    *H04W 28/04*   (2009.01)
    *H04L 27/26*   (2006.01)
    *H04B 7/06*    (2006.01)

(52) U.S. Cl.
    CPC .............. *H04L 5/003* (2013.01); *H04L 25/08* (2013.01); *H03M 13/09* (2013.01); *H04B 1/40* (2013.01); *H04B 7/068* (2013.01); *H04L 27/2647* (2013.01); *H04W 28/04* (2013.01)

(56) References Cited

U.S. PATENT DOCUMENTS

| | | |
|---|---|---|
| 2007/0037528 A1 | 2/2007 | Doan et al. |
| 2008/0240031 A1 | 10/2008 | Nassiri-Toussi et al. |
| 2009/0061795 A1* | 3/2009 | Doan .................. H03J 1/005 455/91 |
| 2010/0261440 A1 | 10/2010 | Corman et al. |

* cited by examiner

COMMUNICATION DEVICE AND ORIENTATION CONTROL METHOD

CROSS-REFERENCE TO RELATED APPLICATION(S)

The present application claims priority under 35 U.S.C. §365 to International Patent Application No. PCT/KR2013/005516 filed Jun. 21, 2013, entitled "COMMUNICATION DEVICE AND ORIENTATION CONTROL METHOD". International Patent Application No. PCT/KR2013/003235 claims priority under 35 U.S.C. §365 and/or 35 U.S.C. §119 (a) to Japanese Patent Application No. 2012-140002 filed Jun. 21, 2012, and which are incorporated herein by reference into the present disclosure as if fully set forth herein.

TECHNICAL FIELD

Embodiments of the present invention relates to a communication device and orientation control method.

BACKGROUND ART

Today, active studies or technological developments are in progress to improve transmission rates in mobile communication systems. Among them, for example, there is a method of using wider band signals to improve transmission rates in the mobile communication system. To transmit such a wider band signal, quasi-millimeter waves with higher frequencies than those of microwaves have to be used. However, using such high-carrier frequency signals sees an increase in propagation loss. It may further lead to a problem, such as reduction of a service area to provide mobile communication services or significant degradation of transmission quality.

Therefore, as a technology to compensate for the propagation loss, for example, antenna array technologies that secure line quality by using array gain are attracting attention. One of the antenna array technologies is disclosed in JP 2008-205645.

In order to attain greater array gain, quite many antenna elements, also called 'array elements', are required compared with a conventional phased array antenna. However, for example, in a case where a frequency converter and an analog-to-digital converter (A/D converter) are installed for each array element, and a signal reproduction process or an orientation (phase) control process is to be performed based on a signal received at each array element, a problem arises that the scale of a circuit or an apparatus becomes significantly larger.

Only if an analog circuit for processing a signal with an intermediate frequency handles combination of signals received by array elements, it is possible to reduce the scale of the circuit or apparatus. However, any sophisticated method (for example, with higher accuracy) in handling signal detection or orientation control cannot be used when the analog circuit combines signals received by array elements. In this case, enhancement of transmission quality cannot be attempted sufficiently.

To address these problems, JP 2008-205645 suggests a method including grouping a plurality of array elements that constitutes a phased array antenna, combining signals received by array elements for each sub-array grouped with the array elements, and handling a process of signal reproduction or orientation control. With the method, it is possible to reduce the scale of an associated circuit or apparatus or utilize more sophisticated scheme, compared with a case that uses a frequency converter or an A/D converter.

Specifically, in the method suggested by JP 2008-205645, a communication device for handling orientation control corrects amplitude or phase based on a known reference transmit signal (for example, equivalent to a training signal) transmitted from a transmitting device. However, since the method is to correct the amplitude or phase based on the reference transmit signal equivalent to a training signal, it cannot be said that the method helps to improve accuracy of orientation control for a signal representing actual data, such as user data.

The above information is presented as background information only to assist with an understanding of the present disclosure. No determination has been made, and no assertion is made, as to whether any of the above might be applicable as prior art with regard to the present invention.

DISCLOSURE OF INVENTION

Solution to Problem

The present invention provides a novel and improved communication device and orientation control method to prevent increase of a scale of a circuit for processing signals received through a phased array antenna and improve accuracy of the orientation control.

In accordance of an aspect of the present invention, provided is a communication device including: a phased array antenna having a plurality of antenna elements arranged on a plane for receiving signals transmitted from one or more transmitting devices; a signal converter for combining signals received through antenna elements for each sub-array and converting the combined signal for each sub-array into a baseband signal, the each sub-array being grouped from the plurality of antenna elements; a signal processor for decoding playback data based on respective baseband signals for sub-arrays in each resource block and detecting an error of the decoded playback data; and an orientation controller for controlling orientation of the phased array antenna based on the base band signals for the sub-arrays and a signal of a resource block with the playback data having no error.

With the communication device, the scale of a circuit related to processing signals received through the phased array antenna may be reduced and good orientation control characteristics may be achieved. Furthermore, increase of a scale of the circuit for processing a signal received through the phased array antenna is prevented while improvement of accuracy of directivity control is achieved.

The orientation controller may include a resource block selector for selecting a resource block with the playback data having no error, a resource block reproducer for reproducing a signal of the selected resource block, a reference signal generator for generating a reference signal to be used as a basis in orientation control, based on the reproduced signal of the resource block, a direction error estimator for estimating an error in a direction toward the orientation based on the baseband signals of the sub-arrays and the reference signal, and an orientation setting unit for setting a direction of orientation of the phased array antenna based on the estimated error.

The resource block selector may select from among resource blocks with the playback data having no error, a resource block in which a combination of a high transmission rate of modulation and encoding is selected and which has no second playback data for a second signal transmitted from any other transmitting device than the transmitting device that transmits a first signal that corresponds to the playback data, the first signal and the second signal being received at the same time through the phased array antenna, or a resource block in which a combination of a high transmission rate of modulation and encoding is selected and which has second playback data with no error for a second signal transmitted from any other transmitting device simultaneously with a first signal that corresponds to the playback data through the phased array antenna.

The direction error estimator may generate a replica interference signal equivalent to an interference signal indicative of interference of a signal transmitted from any other transmitting device with a baseband signal for each of the sub-arrays, based on a channel estimation value from the signal transmitted from the any other transmitting device and on a signal of a resource block that corresponds to the signal transmitted from the any other transmitting device, and eliminate components of the replica interference signal from each baseband signal for each sub-array based on the received signal.

The reference signal generator may generate a replica baseband signal for each sub-array, which is equivalent to a baseband signal for the sub-array, based on a signal of a resource block reproduced in the resource block reproducer, and on an estimation value of a channel re-estimated based on a baseband signal for each sub-array from which components of the replica interference signal are eliminated and the signal of the resource block, and combine replica baseband signals for the sub-arrays and generates the reference signal.

The direction error estimator may detect a phase error component for each sub-array based on correlation of a baseband signal for the sub-array from which the replica interference signal is eliminated and the reference signal, estimates a phase error based on the detected phase error component for the sub-array, and re-set a direction of orientation of the phased array antenna, based on a direction error between arrival direction of the received signal and a set direction of orientation of the phased array antenna, which is converted from the estimated phase error.

The direction error estimator may estimate the phase error using the least squares method.

In accordance of an aspect of the present invention, provided is an orientation control method in a communication device that comprises a phased array antenna having a plurality of antenna elements arranged on a plane for receiving signals from one or more transmitting devices, the method including: combining signals received through antenna elements for each sub-array and converting the combined signal for each sub-array into a baseband signal, the each sub-array being grouped from the plurality of antenna elements; decoding playback data based on respective baseband signals for sub-arrays in each resource block and detecting an error of the decoded playback data; and controlling orientation of the phased array antenna based on the base band signals for the sub-arrays and a signal of a resource block with the playback data having no error.

With the method, the scale of a circuit related to processing signals received through the phased array antenna may be reduced and good orientation control characteristics may be achieved. Furthermore, increase of a scale of the circuit for processing a signal received through the phased array antenna is prevented and improvement of accuracy of directivity control is achieved.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF DRAWINGS

The above and other features and advantages of the present invention will become more apparent by describing in detail exemplary embodiments thereof with reference to the attached drawings in which.

MODE FOR THE INVENTION

Figure 1:
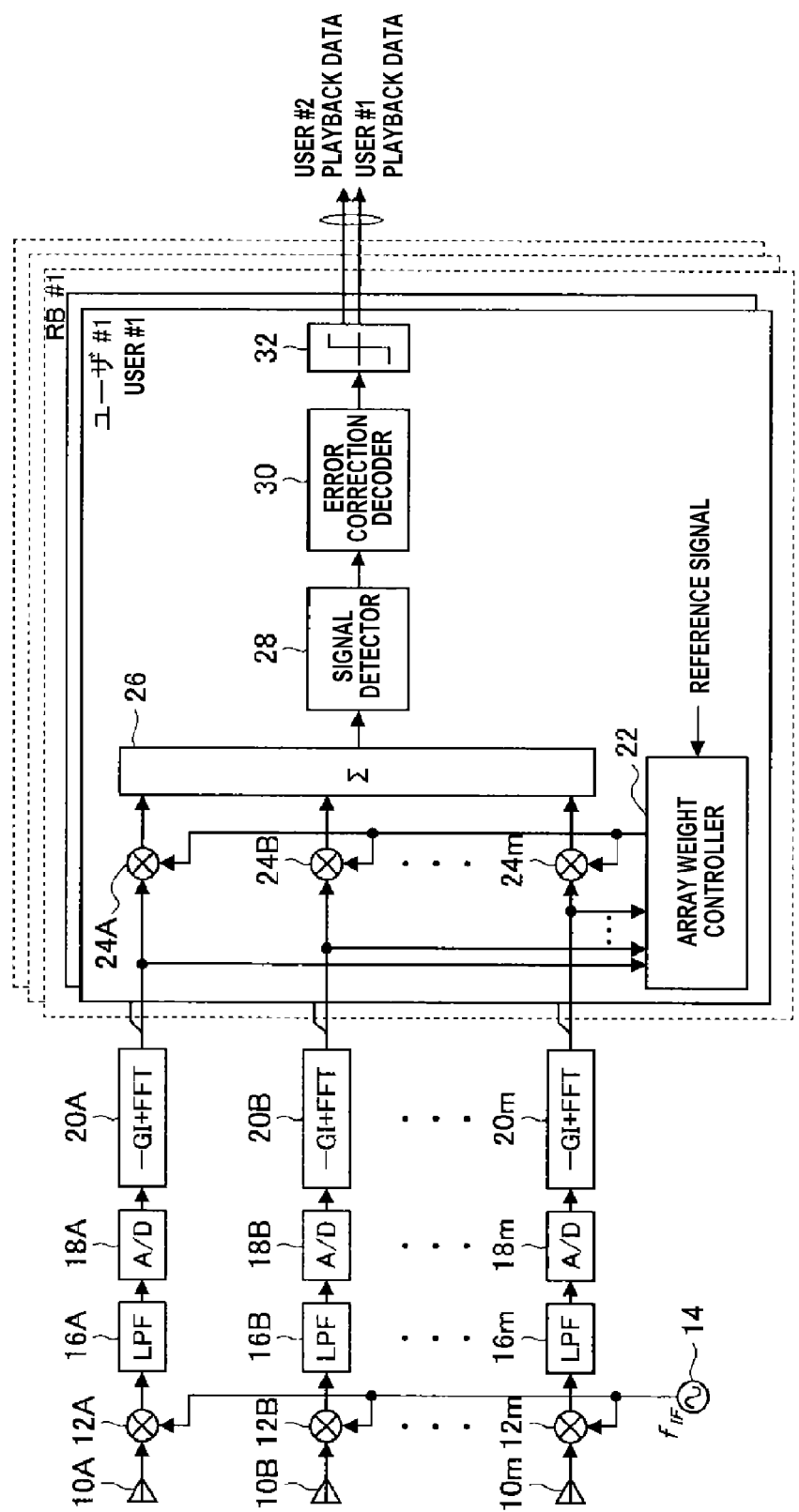
FIG. 1 is an example of a configuration of a first conventional communication device.

Reference will now be made in detail to embodiments, examples of which are illustrated in the accompanying drawings, wherein like reference numerals refer to the like elements throughout. Detailed description of well-known functionalities and configurations will be omitted to avoid unnecessarily obscuring the present invention Embodiments of the present invention will be described below with reference to accompanying drawings. Throughout the specification and the drawings, like reference numerals refer to the like elements.

<Issues of Conventional Communication Device>

Prior to explaining a communication device according to embodiments of the present invention, issues of a conventional communication device will now be described. Following is a case where the conventional communication device handles an Orthogonal Frequency Division Multiplexing (OFDM) modulated signal (also referred to as an OFDM signal').

[A] Issues of First Conventional Communication Device

FIG. 1 is an example of a configuration of a first conventional communication device. Referring to FIG. 1, a first conventional communication device has a frequency converter, a low-pass filter, and an analog-to-digital (A/D) converter for each antenna element of a phased array antenna. In addition, the first conventional communication device also represents a configuration related to digital beam forming.

The first conventional device includes, for example, antenna elements 10A, 10B, ..., 10m, multipliers 12A, 12B, ..., 12m, an oscillator 14 to generate signals with an intermediate frequency, low-pass filters 16A, 16B, ..., 16m, A/D converters 18A, 18B, ..., 18m, Fast Fourier Transform (FFT) circuits 20A, 20B, ..., 20m, an array weight controller 22, multipliers 24A, 24B, ..., 24m, a combination circuit 26, a signal detector 28, an error correction decoder 30, and a decision circuit 32.

Signals received through the antenna elements 10A, 10B, ..., 10m (that forms an array) are frequency-converted by the multipliers 12A, 12B, ..., 12m to have the intermediate frequency $f_{IF}$. That is, the multipliers 12A, 12B, ..., 12m each serve as a frequency converter.

Resultant signals from the frequency conversion in the multipliers 12A, 12B, ..., 12m are then filtered by the low-pass filters 16A, 16B, ..., 16m and sampled by the A/D converters 18A, 18B, ..., 18m. In other words, the low-pass filters 16A, 16B, ..., 16m each serve as a filtering circuit and the A/D converters 18A, 18B, ..., 18m each serve as a sampling circuit. Due to the sampling in the A/D converters 18A, 18B, ..., 18m, subsequent processing in the first conventional communication device is on digital signals.

The FFT circuits 20A, 20B, ..., 20m each eliminate a Guard Interval (GI) of an OFDM signal from the sampled signal and convert the resultant signal to a signal in the frequency domain by fast Fourier transformation.

The array weight controller 22 calculates an array weight vector. The signal in the frequency domain, i.e., a reference signal contained in a received baseband signal is already known to the first conventional communication device, and thus the array weight controller 22 calculates the array weight vector such that the signal in the frequency domain becomes a desired signal.

The multipliers 12A, 12B, ..., 12m multiplies signals in the frequency domain forwarded from the FFT circuits 20A, 20B, ..., 20m by the array weight vector. The combination circuit 26 combines signals from the multipliers 12A, 12B, ..., 12m. The signal detector 28 detects a signal transmitted from a transmitting device (for example, a user equipment owned by a user) from a signal forwarded from the combination circuit 26. In the multipliers 12A, 12B, ..., 12m and the combination circuit 26, product-sum operation with the array weight vector and received data symbols is performed. Upon detection of the signal transmitted from the transmitting device in the signal detector 28, the signal transmitted from the transmitting device is reconstructed.

The error correction decoder 30 corrects errors of a signal detected by the signal detector 28, and the decision circuit 32 decides '0' or '1' of an error corrected signal, which is a digital signal, and outputs a signal (digital signal) indicative of the decision result as playback data (received data) that corresponds to the signal transmitted from the transmitting device.

For example, the first conventional communication device, as shown in FIG. 1, performs an adaptive array control (amplitude and phase control) by collectively performing digital signal processing on the signals received by all the antenna elements. In this case, amplitude and phase are controlled according to an adaptive algorithm or by calculation of an inverse matrix such that an error between a signal in the frequency domain from the FFT circuits 20A, 20B, ..., 20m and the reference signal (a training signal) becomes smaller.

However, the first conventional communication device needs to include a multiplier (frequency converter), a low-pass filter, and an A/D converter for each antenna element of the phased array antenna, as shown in FIG. 1. Thus, the conventional first communication device has a problem that as the number of antenna elements increases (i.e., as the number of array elements is increasingly required), the scale of the circuit related to processing signals received through the phased array antenna significantly increases.

[B] Issues of a Second Conventional Communication Device

Figure 2:
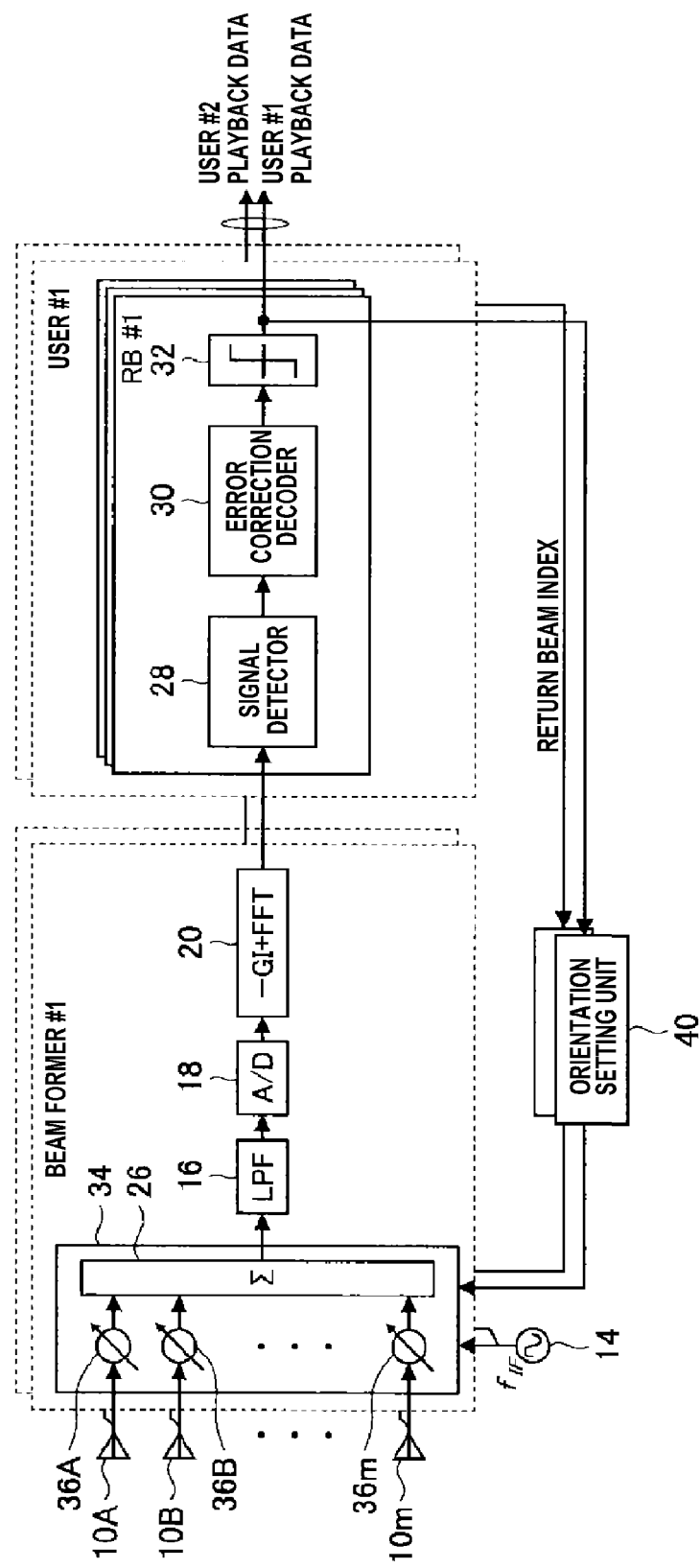
FIG. 2 is an example of a configuration of a second conventional communication device.

FIG. 2 is an example of a configuration of a second conventional communication device. Referring to FIG. 2, the second conventional communication device performs frequency conversion on each signal generated by the oscillator for generating signals with intermediate frequency $f_{IF}$ according to a phase that corresponds to orientation desired a teach antenna element of a phased array antenna, combines such frequency converted signals, and then filters and samples the combined signal with a first set of filter circuit and sampling circuit, respectively. In addition, the second conventional communication device also has a configuration involved in analog beamforming.

The second communication device includes, for example, antenna elements 10A, 10B, ..., 10m, a signal converter 34, the oscillator 14, a low-pass filter 16, an A/D converter 18, an FFT circuit 20, the signal detector 28, the error correction decoder 30, the decision circuit 32, and an orientation setting unit 40. The signal converter 34 further includes respective frequency converters 36A, 36B, ..., 36m for antenna elements 10A, 10B, ..., 10M, and a combination circuit 26.

Signals received through the antenna elements 10A, 10B, ..., 10m (that forms an array) are frequency converted by the frequency converters 36A, 36B, ..., 36m. The combination circuit 26 combines these frequency converted signals from the frequency converters 36A, 36B, ..., 36m. The frequency converters 36A, 36B, ..., 36m convert radio frequencies of signals received from the antenna elements 10A, 10B, ..., 10m to the intermediate frequency $f_{IF}$, thus converting the signals to baseband signals (modulated signals before being carried on carrier waves). For this frequency conversion into baseband signals, the frequency converters 36A, 36B, ..., 36m perform frequency conversion on signals generated by the oscillator 14 according to a phase that corresponds to a desired orientation for each antenna element. The desired orientation is set by the orientation setting unit 40.

The combination circuit 26 combines frequency converted signals from the frequency converters 36A, 36B, ..., 36m, so that beam forming is achieved when the signal converter 34 converted the combined signal originated from the antenna elements 10A, 10B, ..., 10m (that forms an array) to a baseband signal. Therefore, the second conventional communication device has an advantage of just having to have a set of the low-pass filter 16, the A/D converter 18, and the FFT circuit 20 in the output of the signal converter 34.

A signal output from the combination circuit 26 is filtered by the low-pass filter 16 and then sampled by the A/D converter 18. In other words, the low-pass filter 16 serves as a filtering circuit and the A/D converter 18 serves as a sampling circuit. Due to the sampling in the A/D converter 18, subsequent processing in the second conventional communication device is on digital signals.

The FFT circuit 20 eliminates a Guard Interval (GI) of an OFDM signal from the sampled signal and converts the resultant signal into a signal in the frequency domain by fast Fourier transformation.

The signal detector 28 detects a signal transmitted from a transmitting device from the signal output by the FFT circuit 20.

The error correction decoder 30 corrects errors of a signal detected by the signal detector 28, and the decision circuit 32 decides '0' or '1' of an error corrected signal, which is a digital signal, and outputs a signal (digital signal) indicative of the decision result as playback data (received data) that corresponds to the signal transmitted from the transmitting device.

The orientation setting unit 40 sets orientation based on return of an optimum beam index among a plurality of fixed beams included in the playback data transmitted from the transmitting device.

For example, orientation control of the second conventional communication device, as shown in FIG. 2, is switched in a quantization direction based on the returned beam index.

The second conventional communication device also includes a plurality of beam formers that each consist of a signal converter 34, a low-pass filter 16, an A/D converter 18, and an FFT circuit 20. It is possible for each beam former handling signals received from the antenna elements 10A, 10B, . . . , 10m, to receive signals simultaneously from a plurality of transmitting devices.

Compared with the first conventional communication device, as shown in FIG. 1, the second conventional communication device has simpler configuration. With the simpler configuration, it is difficult for the second conventional communication device to utilize more sophisticated method (for example, a highly accurate method) in handling signal detection or orientation control. Thus, the second conventional communication device has difficulty having higher signal detection characteristics in case of optimally adjusting its orientation toward where a transmitting device is located or having a difference between the direction in which the transmitting device is located and a beam direction.

As illustrated with reference to FIGS. 1 and 2, the conventional communication devices suffer from a problem of a large scale of circuit for processing signals received by the phased array antenna or have difficulty having higher signal detection characteristics.

<A Communication Device of an Embodiment of the Present Invention>

A communication device according to an embodiment of the present invention will now be described. In particular, an example where the communication device processes an OFDM modulated signal (or OFDM signal) will be described below. However, signals that the communication device handles are not limited to the OFDM signals.

Figure 3:
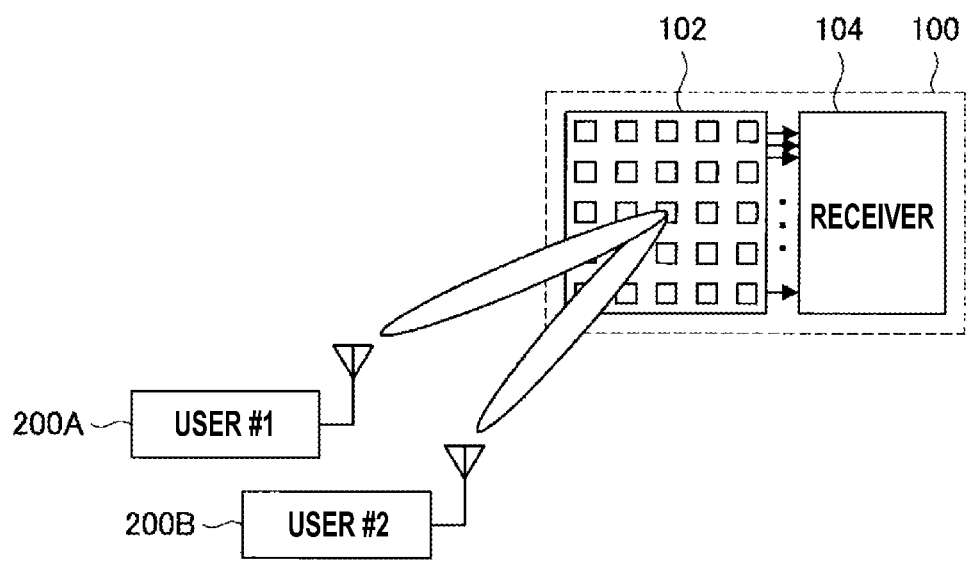
FIG. 3 illustrates a communication system having a communication device according to an exemplary embodiment of the present invention.

[1] Overview of a Communication System Having the Communication Device of an Embodiment of the Present Invention FIG. 3 illustrates a communication system having a communication device, according to an exemplary embodiment of the present invention. Referring to FIG. 3, an overview of a communication device and transmitting device of an embodiment of the present invention will be described first.

In the embodiment, the communication system includes, for example, a communication device 100, and transmitting devices 200A and 200B (sometimes, collectively called a transmitting device 200). Although it is illustrated in FIG. 3 that the communication device 100 receives signals from the two transmitting devices 200 consisting of the transmitting devices 200A and 200B, signals to be received by the communication device 100 are not limited thereto. For example, the communication device 100 may receive signals from one or more transmitting devices and process them.

For convenience of explanation, the transmitting device 200A is denoted by User #1, and even a signal transmitted from the transmitting device 200A is also denoted by User #1. Similarly, for convenience of explanation, the transmitting device 200B is denoted by User #2, and even a signal transmitted from the transmitting device 200B is also denoted by User #2.

[1-1] Overview of a Communication Device of an Embodiment of the Present Invention The communication device 100 includes, for example, a phased array antenna 102 and a receiver 104.

The communication device 100 may also have, for example, a controller (not shown), Read Only Memory (ROM), Random Access Memory (RAM), a second communication unit (not shown) for communicating with external devices. The communication device 100 interconnects those components using a bus as a data transfer path.

The controller consisting of, for example, a Central Processing Unit (CPU) or various processing circuits controls all the operations of the communication device 100. The controller may also serve as, for example, a receiver 104. The receiver 104 may consist of a dedicated or universal processing circuit.

ROM stores control data, such as programs or operation parameters to be used by the controller. RAM temporarily stores, for example, programs to be executed by the controller.

The second communication unit is another communication means equipped in the communication device 100 for wired or wireless communication with external devices. The second communication unit may be e.g. an IEEE 802.11b port and transceiver circuit (for wireless communication), an optical fiber connector and optical Integrated Circuit (IC), a Local Area Network terminal and transceiver circuit (for wired communication), or the like. As a network used in the embodiment of the present invention there may be a wired network, such as LAN, Wide Area Network (WAN), etc., wireless network, such as Wireless LAN (WLAN), Wireless WAN (WWAN), etc., or the Internet using a communication protocol, such as Transmission Control Protocol/Internet Protocol.

The phased array antenna 102 has a plurality of antenna elements arranged on a plane to receive signals transmitted from one or more transmitting devices. The phased array antenna 102 forms, for example, a two-dimensional antenna array, as shown in FIG. 3.

The receiver 104 processes signals received through antenna elements of the phased array antenna 102. Configuration of the receiver 104 will be described in more detain later.

The communication device 100 receives signals transmitted from the transmitting devices 200 at the same time or at different times, and hen reproduces the signals. The communication device 100 needs to estimate respective direction of the transmitting devices 200 from signals interfering with each other transmitted from the transmitting devices 200 in order to direct respective beams (or orientation of beams) toward the transmitting devices 200.

Figure 4:
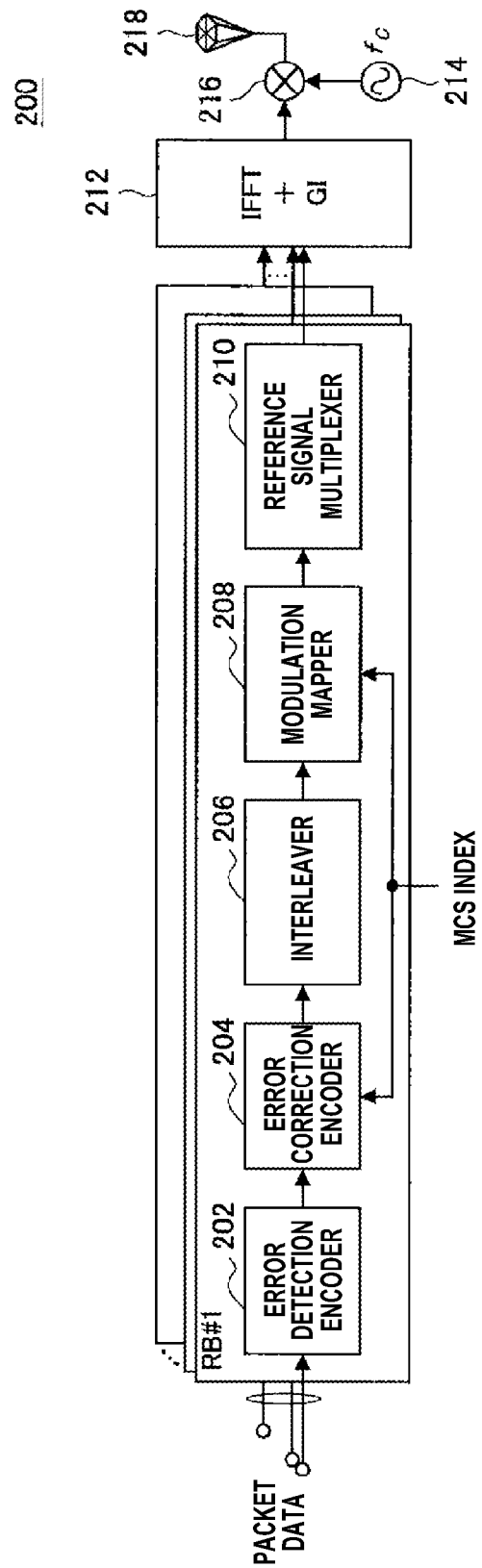
FIG. 4 is a block diagram of a transmitting device, according to an exemplary embodiment of the present invention.

[1-2] Overview of a Transmitting Device of an Embodiment of the Present Invention FIG. 4 illustrates part of a transmitting device, according to an exemplary embodiment of the present invention. Referring to FIG. 4, an example of configuration related to signal transmission is shown in the transmitting device 200.

The transmitting device 200 includes, for example, an error detection encoder 202, an error correction encoder 204, an interleaver 206, a modulation mapper 208, a reference signal multiplexer 210, an Inverse Fast Fourier Transform (IFFT) unit 212, an oscillator 214 for generating a signal with a frequency $f_c$, a multiplier 216, and an antenna 218. The error detection encoder 202, the error correction encoder 204, the interleaver 206, the modulation mapper 208, and the reference signal multiplexer 210 process packet data for transmission for each Resource Block (RB).

The error detection encoder 202 adds a code for error detection, such as Cyclic Redundancy Check (CRC) code to the packet data for transmission.

The error correction encoder 204 adds a code for error correction, such as turbo code or Low-Density Parity-check Code (LDPC) code to the packet data for transmission. The interleaver 206 performs interleaving on the packet data sent from the error correction encoder 204, and the modulation mapper 208 modulation-maps the interleaved packet data from the interleaver 206. Coding rate used in the error correction encoder 204 and modulation orders used in the modulation mapper 208 are designated as Modulation and Coding Set (MCS) indexes by, for example, the communication device 100 or a base station, depending on, for example, a channel condition for each resource block.

The reference signal multiplexer 210 multiplexes the reference signal to be used for channel estimation for a packet data sent from the modulation mapper 208. The packet data (digital signals) resulting from multiplexing of the reference signal in the reference signal multiplexer 210 corresponds to a baseband signal.

Figure 5:
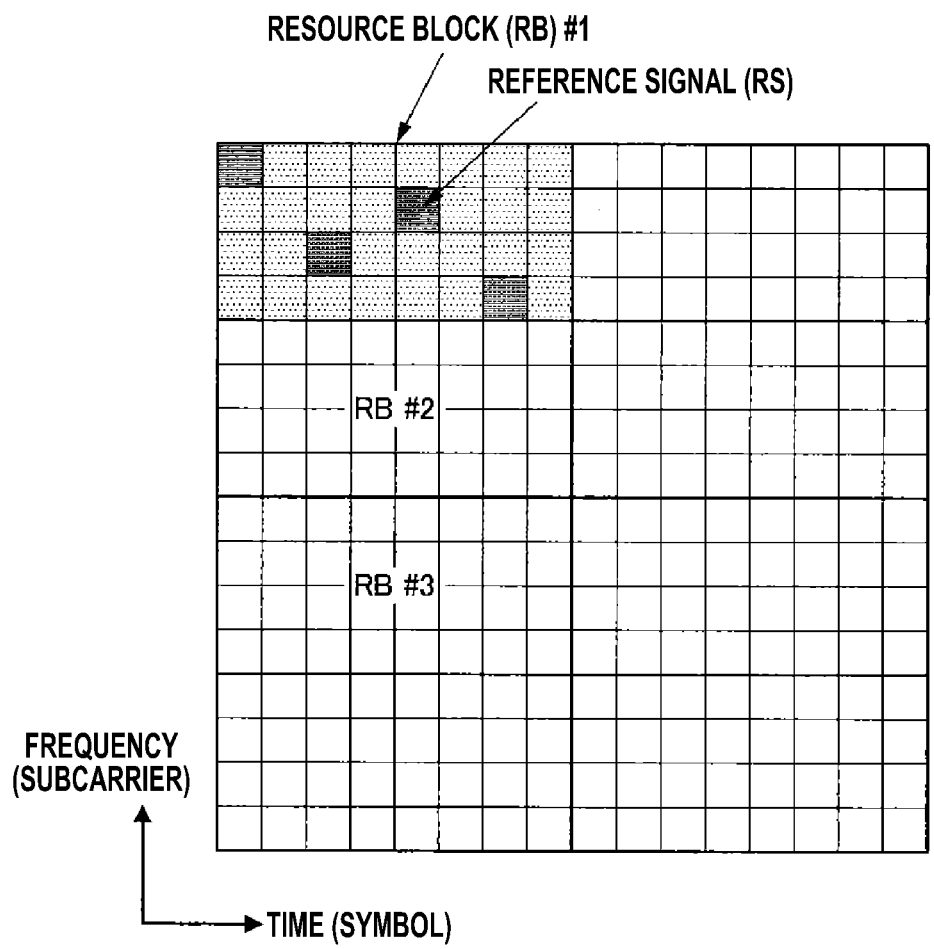
FIG. 5 illustrates an example of a baseband signal transmitted from a transmitting device, according to an exemplary embodiment of the present invention.

FIG. 5 illustrates a baseband signal transmitted from the transmitting device 200, according to an exemplary embodiment of the present invention. Referring to FIG. 5, a baseband signal is illustrated where the transmitting device 200 transmits an OFDM signal.

As shown in FIG. 5, the transmitting device 200 sets a resource block that consists of OFDM symbols in the time direction and sub-carriers in the frequency direction. The modulation mapper 208 modulation-maps a first codeword generated by the error correction encoder 204 and arranges the result within the resource block. The reference signal multiplexer 210 multiplexes the reference signal, as shown in FIG. 5. For the purposes of convenience, a multiplexed reference signal is illustrated only in resource block #1 (RB #1).

Turning back to FIG. 4, an embodiment of the transmitting device 200 will now be described. The IFFT unit 212 IFFT-transforms the packet data sent from the reference signal multiplexer 210 to a signal in the time domain and adds GI to the result. Processing in the IFFT unit 212 corresponds to generation of a signal for transmission (also, called transmit signal) from the transmitting device 200.

The transmit signal output from the IFFT unit 212 is modulated in the multiplexer 216 and transmitted through the antenna 218 toward the communication device 100. Signal transmission toward the communication device 100 may be implemented by, for example, a sector antenna, transmit beam forming, etc.

With the configuration of FIG. 4, the transmitting device 200 transmits signals to the communication device 100.

[2] An Example of Configuration of a Communication Device of an Embodiment of the Present Invention The configuration of the communication device 100 will now be described in more detail. This is a case where the communication device 100 receives signals from two transmitting devices 200, the transmitting device 200A and the transmitting device 200B, as shown in FIG. 3.

Figure 6:
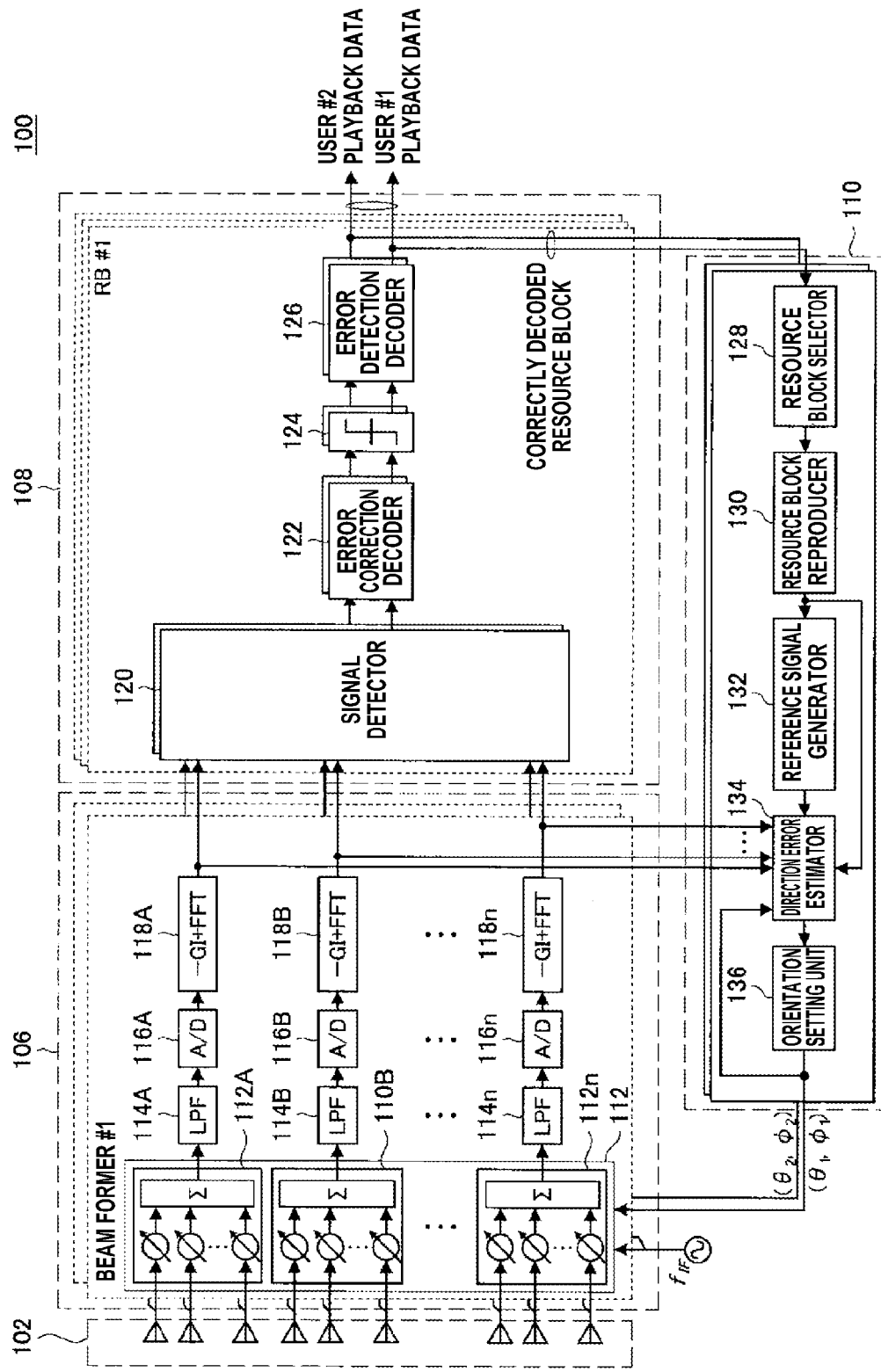
FIG. 6 is a block diagram of a communication device, according to an exemplary embodiment of the present invention.

[2-1] Configuration of a Communication Device of an Embodiment of the Present Invention FIG. 6 illustrates a configuration of the communication device 100, according to an exemplary embodiment of the present invention.

The communication device 100 includes, for example, a phased array antenna 102, a signal converter 106, a signal processor 108, and an orientation controller 110. The signal converter 106, the signal processor 108, and the orientation controller 110 correspond to the receiver 104 of FIG. 3.

Figure 7:
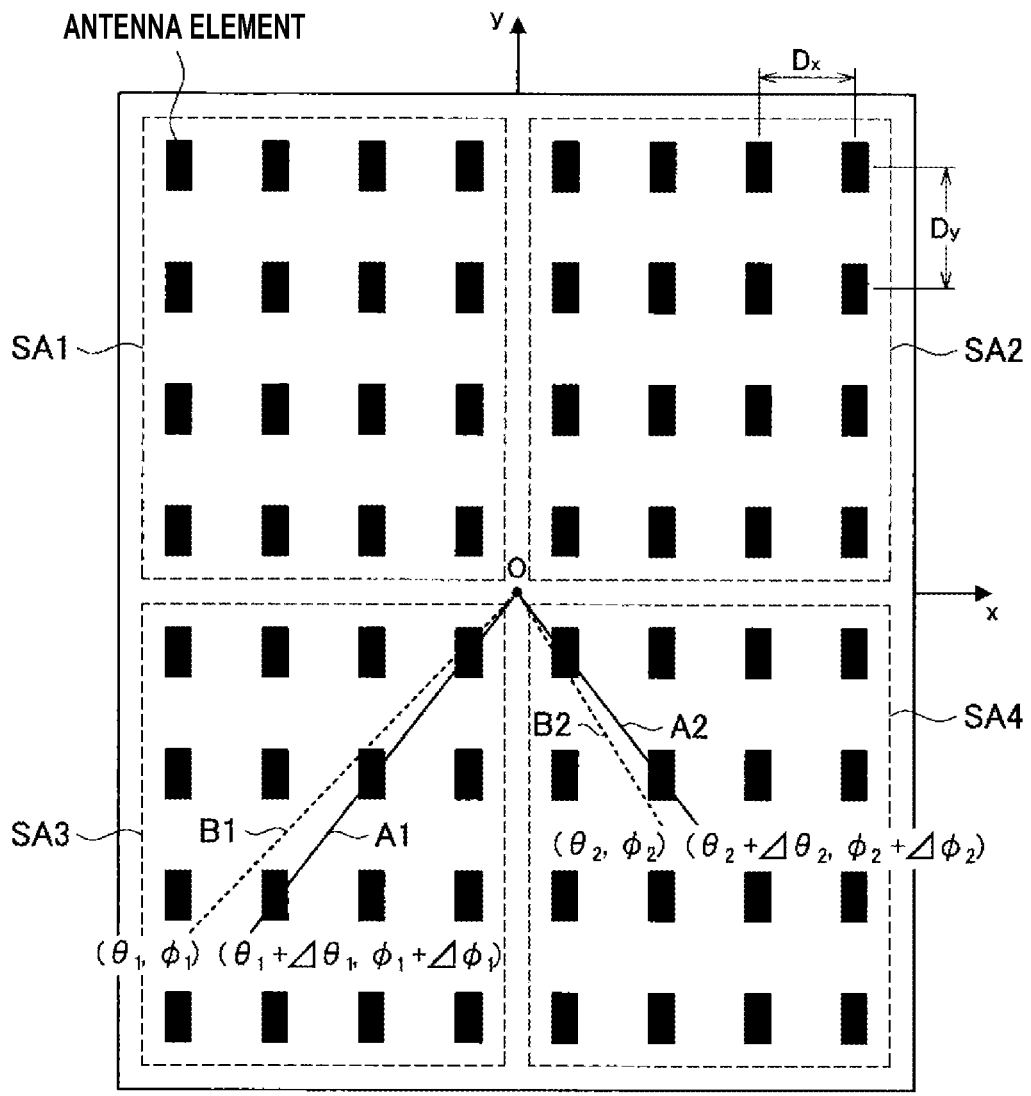
FIG. 7 illustrates an exemplary phased array antenna equipped in a communication device, according to an exemplary embodiment of the present invention.

The phased array antenna 102 has a plurality of antenna elements arranged on a plane to receive signals transmitted from one or more transmitting devices. FIG. 7 illustrates the phased array antenna 102 equipped in the communication device 100, according to an exemplary embodiment of the present invention.

In the communication device 100, a plurality of antenna elements that form the phased array antenna 102 are grouped and divided into sub-arrays. Referring to FIG. 7, there are four sub-arrays SA1 to SA4 divided from the plurality of antenna elements of the phased array antenna 102.

A1 denotes a direction in which the transmitting device 200A exists, and B1 denotes an orientation of the communication device 100 looking toward the transmitting device 200A. Similarly, A2 denotes a direction in which the transmitting device 200B exists, and B2 denotes an orientation of the communication device 100 looking toward the transmitting device 200B.

Referring to FIG. 7, as seen from A1 of (azimuth, elevation) $(\theta 1, \phi 1)$ and B1 of (azimuth, elevation) $(\theta 1+\Delta\theta 1, \phi 1+\Delta\phi 1)$, there are an azimuth error $\Delta\theta 1$ and elevation error $\Delta\phi 1$. The communication device 100 controls orientation of the phased array antenna 102 toward the transmitting device 200A such that the azimuth error $\Delta\phi 1$ and the elevation error $\Delta\phi 1$ become smaller. More specifically, the communication device 100 sets the orientation of the phased array antenna 102 such that the azimuth error $\Delta\phi 1$ and elevation error $\Delta\phi 1$ become smaller.

As seen from A2 of (azimuth, elevation) $(\theta 2, \phi 2)$ and B2 of (azimuth, elevation) $(\theta 2+\Delta\theta 2, \phi 2+\Delta\phi 2)$, there are an azimuth error $\Delta\theta 2$ and elevation error $\Delta\phi 2$. The communication device 100 controls orientation of the phased array antenna 102 toward the transmitting device 200B such that the azimuth error $\Delta\theta 2$ and the elevation error $\Delta\phi 2$ become smaller. More specifically, the communication device 100 sets the orientation of the phased array antenna 102 such that the azimuth error $\Delta\theta 2$ and elevation error $\Delta\phi 2$ become smaller.

Although each sub-array is illustrated in FIG. 7 to have 16 antenna elements, the number of antenna elements that forms each sub-array is not limited thereto. For example, a sub-array of the communication device 100 may consist of four or more antenna elements including 2 (in horizontal direction)×2 (in vertical direction) to allow beam control at azimuth and elevation angles. The number of sub-arrays is not limited to four. For example, the phased array antenna 102 may be divided into two or more sub-arrays. Furthermore, although in the embodiment of FIG. 7 the number of antenna elements for each sub-array is the same, it may vary depending on each sub-array.

Turning back to FIG. 6, an embodiment of the communication device 100 will now be described. The signal converter 106 combines signals received through antenna elements for each sub-array and converts the combined signal into a baseband signal.

The signal converter 106 includes, for example, a converter 112, low-pass filters 114A, 114B, . . . , 114$n$ (or collectively denoted by 114), A/D converters 116A, and 116B, . . . , 116M (or collectively denoted by 116), FFT circuits 118A, 118B, . . . , 118$m$ (or collectively denoted by 118).

The converter 112 includes, for example, conversion circuits 112A, 112B, . . . , 112$n$ for each sub-array that have the same configuration as that of the signal converter 34 of FIG. 2. With the configuration as shown in FIG. 6, the converter 112 converts a frequency of a signal received through each antenna element and combines the frequency-converted signals. Operations of the converter 112 are also controlled by the orientation controller 110.

In this embodiment, the combined signal for each sub-array is equivalent to a beamformed signal. Thus the signal converter 106 only needs to have a set of the low-pass filter 114, the A/D converter 116, and the FFT circuit 118 for each sub-array.

Compared with the conventional device as shown in FIG. 1, the communication device 100 may reduce the scale of the circuit related to processing the signal received through the phased-array antenna.

A signal output from each of the conversion circuits 112A, 11B, . . . , 112n is filtered by the corresponding low-pass filter 114 and then sampled by the corresponding A/D converter 116. In other words, the low-pass filter 114 serves as a filtering circuit and the A/D converter 116 serves as a sampling circuit. Due to the sampling in the A/D converter 116, subsequent processing in the second conventional communication device is on digital signals.

The FFT circuit 118 eliminates a Guard Interval (GI) of an OFDM signal from the sampled signal forwarded from the corresponding A/D converter 116 and converts the resultant signal into a signal in the frequency domain by fast Fourier Transformation. Signals output from the FFT circuits 118 are equivalent to baseband signals (for example, packet data resulting from multiplexing of a reference signal in the reference signal multiplexer 210 of the transmitting device 200 as shown in FIG. 4).

With the configuration of FIG. 6, the signal converter 106 combines signals received through antenna elements for each sub-array and converts the combined signal into a baseband signal.

However, the configuration of the signal converter 106 is not limited to what is shown in FIG. 6. For example, although the signal converter 106 includes filtering circuits, which are low-pass filters, in FIG. 6, the filtering circuits may be replaced by band-pass filters in other embodiments.

Furthermore, although in FIG. 6 the signal converter 106 includes two beam formers that each have converters 112, low-pass filters 114, A/D converters 116, and FFT circuits 118, the signal converter 106 may include one or three or more beam formers in other embodiments. The signal converter 106 may process signals transmitted from a plurality of transmitting devices, the number of which is equal to or more than the number of beam formers therein for time division.

The signal processor 108 decodes playback data (received data) based on respective baseband signals for sub-arrays in each resource block, and detects an error of the decoded playback data.

The signal processor 108 includes, for example, a signal detector 120, an error correction decoder 122, a decision circuit 124, and an error detection decoder 126.

The signal detector 120 detects a signal transmitted from any of the transmitting devices 200 based on a baseband signal for each sub-array forwarded from the corresponding FFT circuit 118. The signal detector 120 detects a signal transmitted from any of the transmitting devices 200 by, for example, combination of baseband signals for sub-arrays forwarded from the FFT circuits 118 or signal detection from a baseband signal for a corresponding sub-array.

The signal detector 120 detects a signal transmitted from a different transmitting device 200 for each beam former. For example, the signal detector 120 detects a signal transmitted from the transmitting device 200A (or 200B) based on corresponding baseband signals of sub-arrays forwarded from beam former #1, and detects a signal transmitted from the transmitting device 200B (or 200A) based on corresponding baseband signals of sub-arrays forwarded from beam former #2.

The error correction decoder 122 corrects an error of a transmitted signal detected in the signal detector 120 based on a code for error correction, such as a turbo code, LDPC code, etc. included in the transmitted signal detected in the signal detector 120.

The decision circuit 124 decides '0' or '1' of an error corrected signal (i.e., a digital signal), and outputs a (digital) signal indicative of the decision result as playback data (received data) that corresponds to the signal transmitted from the transmitting device 200.

The error detection decoder 126 detects an error of playback data based on a code for error detection, such as a CRC code included in the playback data sent from the decision circuit 124.

With the configuration of FIG. 6, the signal processor 108 decodes the playback data (received data) based on respective baseband signals for sub-arrays in each resource block, and detects an error of the decoded playback data.

However, the configuration of the signal processor 108 is not limited to what is shown in FIG. 6. For example, although it is illustrated in FIG. 6 that the error correction in the error corrector 122 is followed by error detection in the signal processor 108, the signal processor 108 may not include the error corrector 122 in other embodiments.

The orientation controller 110 controls the orientation of the phased array antenna 102 based on the based band signal for each sub-array and a signal (corresponding to the playback data) of a resource block with playback data having no error.

The orientation controller 110 includes, for example, a resource block selector 128, a resource block reproducer 130, a reference signal generator 132, and a direction error estimator 134, and an orientation setting unit 136.

The resource block selector 128 selects a resource block whose playback data has no error.

Operations of the resource block selector 128 are not limited to selection of a resource block. For example, the resource block selector 128 may select a resource block that meets following conditions (a) and (b) or (c) from among resource blocks whose playback data has no error. The resource block selector 128 may also select a resource block that meets the condition (b) or (c) from among resource blocks whose playback data has no error.

(a) a resource block for which a combination of high transmission rate based modulation and encoding is selected (a resource block having a good channel condition)

(b) a resource block in which there is no second playback data for a second signal received from any other transmitting device than the transmitting device that transmits a first signal corresponding to first playback data, the first and second signals being received in the same period of time (c) a resource block in which there is second playback data for a second signal received from any other transmitting device than the transmitting device that transmits a first signal corresponding to first playback data, the first and second signals being received in the same period of time and the second playback data having no error.

In the embodiment of the communication system of FIG. 3, if the transmitting device that transmits the first signal corresponding to the first playback data represented in (b) and (c) is the transmitting device 200A, any other transmitting device that transmits the second signal corresponding to the second playback data, as represented in (b) and (c) is the transmitting device 200B. Similarly, if the transmitting device that transmits the first signal corresponding to the first playback data represented in (b) and (c) is the transmitting device 200B, any other transmitting device that transmits the second signal corresponding to the second playback data, as represented in (b) and (c) is the transmitting device 200A.

Then, if the resource block selector 128 selects a resource block that meets conditions (a), and (b) or (c) or a resource block that meets the condition (b) or (c), the resource block selector 128 selects a resource block that has not processed the second signal transmitted from any other transmitting device 200, or a resource block that may be correctly reproduced as a result of processing the second signal transmitted from any other transmitting device 200.

The resource block reproducer 130 reproduces the signal of the resource block selected by the resource block selector 128. The resource block reproducer 130 reproduces the signal of the selected resource block by, for example, re-encoding and re-modulation mapping of the playback data (decoded data) of the resource block selected by the resource block selector 128.

The reference signal generator 132 generates a reference signal to be used as a basis in orientation control, based on the signal of the resource block reproduced by the resource block reproducer 130. The reference signal may correspond to a signal at a center position (for example, a point o, as shown in FIG. 7) of the phased array antenna 102. Operations of the reference signal generator 132 will be described in more detail later.

The direction error estimator 134 estimates an error in the direction toward the orientation of the phased array antenna 102 (or called direction error) based on baseband signals for sub-arrays from the signal converter 106 and the reference signal generated by the reference signal generator 132. The direction error includes, for example, azimuth error $\Delta\theta 1$ and elevation error $\Delta\phi 1$, or azimuth error $\Delta\theta 2$ and elevation error $\Delta\phi 2$, as shown in FIG. 7. Operations of the direction error estimator 134 will be described in more detail later.

The orientation setting unit 136 sets a direction of the orientation of the phased array antenna 102 based on the direction error estimated by the direction error estimator 134. Operations of the orientation setting unit 136 will be described in more detail later.

The orientation controller 110 controls the orientation of the phased array antenna 102 based on baseband signals for sub-arrays and a signal of a resource block whose playback data has no error.

[2-2] Orientation Control in the Communication Device 100 of an Embodiment of the Present Invention Orientation control in the communication device 100 will now be described in more detail.

Figure 8:
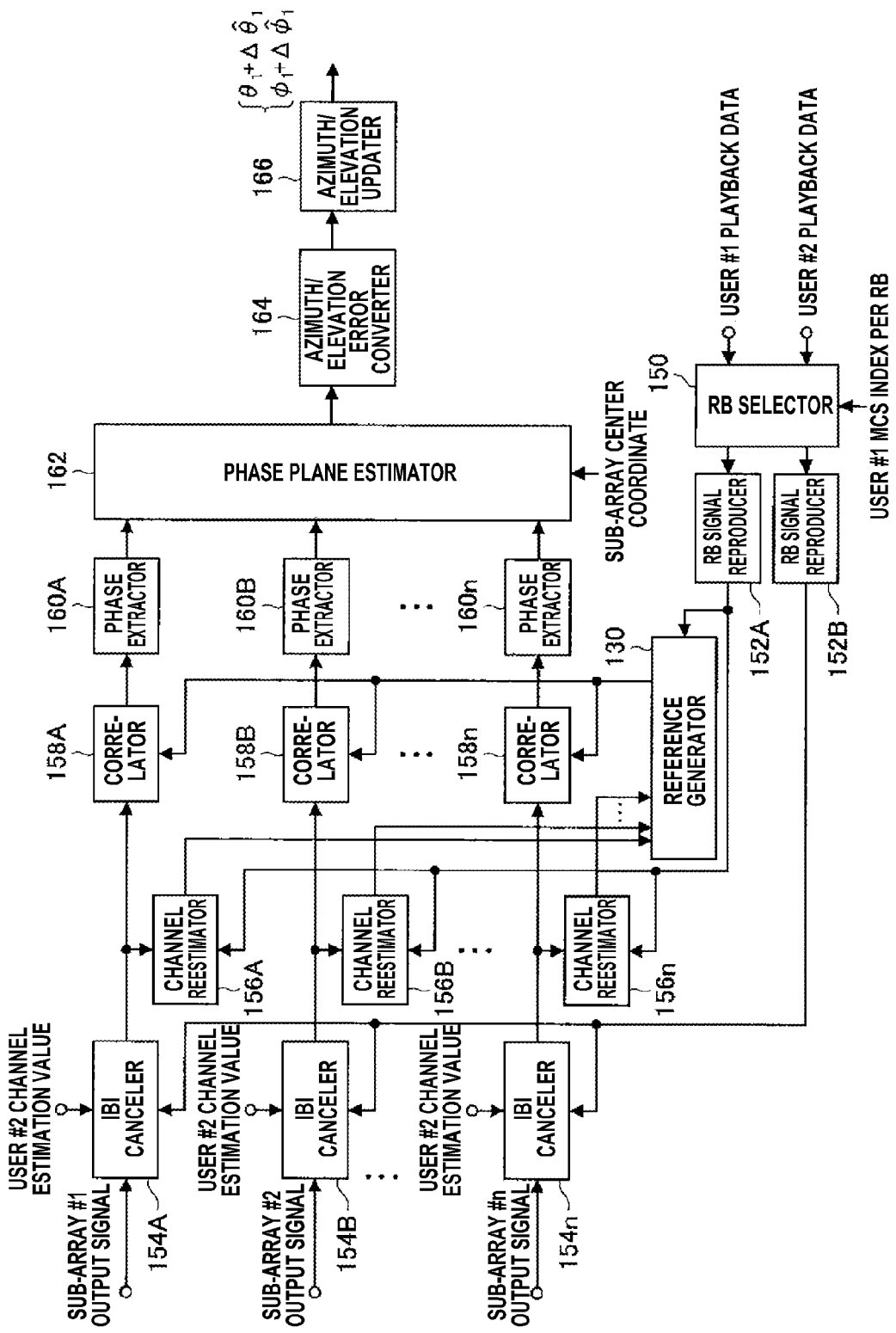
FIG. 8 illustrates a communication device for explanation of orientation control, according to an exemplary embodiment of the present invention.

FIG. 8 illustrates a block diagram for explaining orientation control in the communication device 100, according to an exemplary embodiment of the present invention. FIG. 8 illustrates an exemplary configuration of the orientation controller 110.

In the communication device 100, a controller (now shown) implemented with, for example, a CPU serves as the orientation controller 110, and the orientation controller 110 that constitutes the receiver 102 may be implemented by a dedicated or universal processing circuit. Processes of the orientation controller 110 may also be implemented by hardware, software (or program codes), or combination thereof.

In the following embodiment, assuming a case to control the orientation toward the transmitting device 200A as represented in FIG. 3, configuration of the orientation controller 110 and orientation control in the communication device 100 will be described. Referring to FIG. 8, with the configuration of the orientation controller 110, the communication device 100 may control the orientation toward the transmitting device 200B as shown in FIG. 3, by performing the process, such as the orientation control process.

The transmitting device 200 is denoted as the 'User', and the transmitting device 200A is denoted as 'User #1' and the transmitting device 200B as 'User #2".

The orientation controller 110 includes, for example, the reference signal generator 130, an RB selector 150, RB signal reproducers 152A and 152B, IBI cancelers 154A, 154B, ..., 154n for sub-arrays, channel re-estimators 156A, 156B, ..., 156n for sub-arrays, correlators 158A, 158B, ..., 158n for sub-arrays, phase extractors 160A, 160B, ..., 160n for sub arrays, a phase plane estimator 162, an azimuth/elevation error converter 164, and an azimuth/elevation updater 166.

The RB selector 150 corresponds to the resource block selector 128, and the RB signal reproducers 152A and 152B (sometimes, collectively called an RB signal reproducer 152) corresponds to the resource block reproducer 130. For example, the IBI cancelers 154A, 154B, ..., 154n (sometimes, collectively called an IBI canceler 154), the channel re-estimators 156A, 156B, ..., 156n (sometimes, collectively called a channel re-estimator 156), the correlators 158A, 158B, ..., 158n (sometimes, collectively called a correlator 158), the phase extractors 160A, 160B, ..., 160n (sometimes, collectively called a phase extractor 160), and the phase plane estimator 162 all correspond to the direction error estimator 134. Furthermore, for example, the azimuth/elevation error converter 164 and the azimuth/elevation updater 166 correspond to the orientation setting unit 136. In the orientation controller 110, the azimuth/elevation error converter 164 may correspond to the direction error estimator 134 and the azimuth/elevation updater 166 may correspond to the orientation setting unit 136.

An orientation control process will now be described with reference to FIG. 8.

A receive array vector having symbol k ($1 \le k \le K$) of sub-array n ($1 \le n \le N$) of a beam former for user u (u=1, 2) and sub-carrier m ($1 \le m \le M$) is represented in Equation 1. The term gu(m) in the Equation 1 is represented in Equation 2 and denotes a channel vector for the user u. The term Su(k,m) in the Equation 1 denotes a transmit signal transmitted from the user u, and the term $\eta(k,m)$ denotes a noise vector.

MathFigure 1

$$x(k,m)=[x_1(k,m),x_2(k,m),\ldots,x_N(k,m)]^T=g_1(m)s_1(k,m)+g_2(m)s_2(k,m)+\eta(k,m) \qquad [\text{Math.1}]$$

MathFigure 2

$$g_u(m)=[g_{u,1}(k,m),g_{u,2}(k,m),\ldots,g_{u,N}(k,m)]^T \qquad [\text{Math.2}]$$

The RB selector 150 selects a plurality of resource blocks having higher order of modulation mapping and higher coding rate from among resource blocks of User #1 in which both playback data of User #1 and playback data of User #2 has no error. That is, the RB selector 150 selects resource blocks having good channel condition. As described above, operations of the RB selector 150 that corresponds to the resource block selector 128 are not limited to such processing.

The RB signal reproducer 152 reproduces the signal of the resource block selected by the RB selector 150. More specifically, the RB signal reproducer 152A reproduces the signal of the selected resource block by performing re-encoding and re-modulation mapping on the playback data (decoded data) of User #1 of the selected resource block. The RB signal reproducer 152B also reproduces the signal of the selected resource block by performing re-encoding and re-modulation mapping on the playback data (decoded data) of User #2 of the selected resource block.

The IBI canceler 154 generates a replica interference signal based on a channel estimation value of User #2 in an output signal for each sub-array (which is equal to a baseband signal from the FFT circuit 118) and the signal of the selected resource block sent from the RB signal reproducer 152B. The replica interference signal corresponds to an interference signal that indicates interference of a signal transmitted from User #2 with the output signal of each sub-array of the beam former #1. The channel estimation value of User #2 is estimated based on, for example, a reference signal included in the signal transmitted from User #2.

The IBI canceler 154 also subtracts the generated replica interference signal from the output signal for each sub array of the beam former #1, and eliminates components of the replica interference signal from the output signal for each sub array. Consequently, the IBI canceler 154 cancels Inter-Beam Interference (IBI) for an output signal for each sub-array of the beam former #1, as represented by Equation 3. In Equation 3, r(k,m) denotes a signal after the IBI is canceled by eliminating components of the replica reference signal.

MathFigure 3

$$r(k,m) = x(k,m) - \hat{g}_u(m) s_u(k,m) \qquad \text{[Math.3]}$$

With the IBI canceler 154, the direction error estimator 134 is capable of canceling the IBI for a baseband signal for each sub-array. In other words, the direction error estimator 134 generates the replica interference signal based on a channel estimation value based on a signal transmitted from any other transmitting device and a signal of a resource block that corresponds to a signal transmitted from the other transmitting device, which is generated by the resource block reproducer 130. The direction error estimator 134 eliminates components of the replica interference from each baseband signal for each sub-array based on received signals.

The channel re-estimator 156 re-estimates a channel of User #1 based on the signal from which components of the replica interference signal are eliminated (i.e., the baseband signal for each sub-array from which components of the replica reference signal are eliminated) and the signal of the selected resource block sent from the RB signal reproducer 152A (i.e., the signal of the resource block reproduced in the resource block reproducer 130).

More specifically, the channel re-estimator 156 performs re-estimation of a channel, for example, by an operation as represented by Equation 4 "K" denotes the number of symbols in each sub-carrier in a resource block, and "gu(m)" denotes a channel response at an array center (for example, the point o as shown in FIG. 7). "$\Phi_u(n)$" denotes a phase rotation component generated due to an error between the orientation of the phased array antenna 102 and an arrival direction of a signal. For example, with Equation 4, not only the reference signal but also all the signals in the resource block will be used, and thus the channel re-estimator 156 may perform highly accurate channel estimation for each sub-carrier.

MathFigure 4

$$\bar{g}_u^{(n)}(m) = \frac{1}{K}\sum_{k=1}^{K}\frac{r_n(k,m)s_u^*(k,m)}{|s_u(k,m)|^2} \qquad \text{[Math.4]}$$

$$\cong \Phi_u^{(n)} g_u(m).$$

The reference signal generator 130 generates a reference signal based on a signal of the selected resource block sent from the RB signal reproducer 152A and a channel re-estimation value for each sub-array sent form the channel re-estimator 156.

More specifically, the reference signal generator 130 generates a replica baseband signal for each sub-array which is equivalent to a baseband signal for each sub-array based on a signal of a selected resource block sent form the RB signal reproducer 152A (a signal of the resource block reproduced in the resource block reproducer 130) and the re-estimated channel estimation value. The reference signal generator 130 generates a reference signal by combining replica baseband signals generated for sub-arrays.

The reference signal generator 130 generates a reference signal by an operation as represented by Equation 5. For example, if sub-arrays are symmetrically arranged as shown in FIG. 7, "$\Phi_u(n)$" is a real number in Equation 5. In Equation 5, Z u (k,m) (the replica baseband signal) becomes a reference signal in the orientation control, because it is an output signal of the entire phased array antenna 102, i.e., a signal at the array center.

MathFigure 5

$$z_u(k,m) = \frac{1}{N}\sum_{n=1}^{N}\bar{g}_{u,n}(m)s_u(k,m) \qquad \text{[Math.5]}$$

$$\cong \left(\frac{1}{N}\sum_{n=1}^{N}\Phi_u^{(n)}\right)g_u(m)s_u(k,m)$$

$$= \gamma \cdot g_u(m)s_u(k,m)$$

The correlator 158 performs correlation with an output signal of each sub-array from which the replica interference signal components are eliminated by the IBI canceler 154 over K symbols and M sub-carriers, based on the output signal from the IBI canceler 154 and the reference signal generated by the reference signal generator 130.

More specifically, the correlator 158 calculates a correlation value that represents correlation between the reference signal and the output signal from the IBI canceler 154 by an operation as represented by Equation 6.

MathFigure 6

$$\rho_u^{(n)}(m) = \frac{1}{M \cdot K}\sum_{m=1}^{M}\sum_{k=1}^{K}\frac{r_u^{(n)}(k,m)z_u^*(k,m)}{|z_u(k,m)|^2} \qquad \text{[Math.6]}$$

$$\cong \frac{1}{M \cdot K}\sum_{m=1}^{M}\sum_{k=1}^{K}\frac{\Phi_u^{(n)}|g_u(m)|^2|s_u(k,m)|^2\gamma}{|g_u(m)|^2|s_u(k,m)|^2\gamma^2}$$

$$= \Phi_u^{(n)}\gamma^{-1}.$$

As represented by Equation 6, the phase rotation component $\Phi u (n)$ generated by an error between the orientation of the phased array antenna 102 and the arrival direction of the signal appears in the correlation value pu(n). Also, with the operation of Equation 6, it appears in the correlation value pu(n) that disturbance from residual IBI or noise is suppressed.

The phase extractor 160 extracts a phase error component for each sub-array based on the correlation value calculated by the corresponding correlator 158. More specifically, the phase extractor 160 obtains an amount of phase rotation that corresponds to a phase error component by calculating an rotation component of the correlation value as represented in Equation 6, or extracting an imaginary part of the correlation value as represented in Equation 7.

MathFigure 7

$$\xi_u(n)=Im\{\rho_u^{(n)}\} \qquad [Math.7]$$

With the correlator 158 and the phase extractor 160, the direction error estimator 134 may detect a phase error component for each sub-array based on correlation of a baseband signal for each sub-array from which any component of the replica reference signal is eliminated with the reference signal.

The phase plane estimator 162 estimates a phase error based on the amount of phase rotation (a phase error component) for each sub-array sent from the phase extractor 160 and coordinates of a center of each sub array, and by calculating amounts of phase rotation of the azimuth and elevation angles via phase plane estimation.

More specifically, the phase plane estimator 162 calculates amounts of phase rotation of the azimuth and elevation angles by phase plane estimation using, for example, the least squares method. However, phase plane estimation performed by the phase plane estimator 162 is not limited to the use of the least squares method. For example, the phase plane estimator 162 may calculate amounts of phase rotation of the azimuth and elevation angles by the phase plane estimation using different estimation methods, such as Robust estimation. Operations of the phase plane estimator 162 will now be described where the phase plane estimator 162 calculates amounts of phase rotation of the azimuth and elevation angles via the phase plane estimation using the least squares method.

For example, coordinates of a center of each sub-array may be represented by Equation 8. In equation 8, (dix(x), diy(y)) denotes an array coordinates for array index (ix, iy), and A denotes a subset of arrays included in the sub-array n. Thus, (ax(n), ay(n)) denotes coordinates of an array center of the sub-array n.

MathFigure 8

$$\begin{cases} a_x(n) = \dfrac{1}{N} \sum_{i_x \in \Lambda_n} d_{i_x}^{(x)} \\ a_y(n) = \dfrac{1}{N} \sum_{i_y \in \Lambda_n} d_{i_y}^{(y)} \end{cases} \qquad [Math.\ 8]$$

Figure 9:
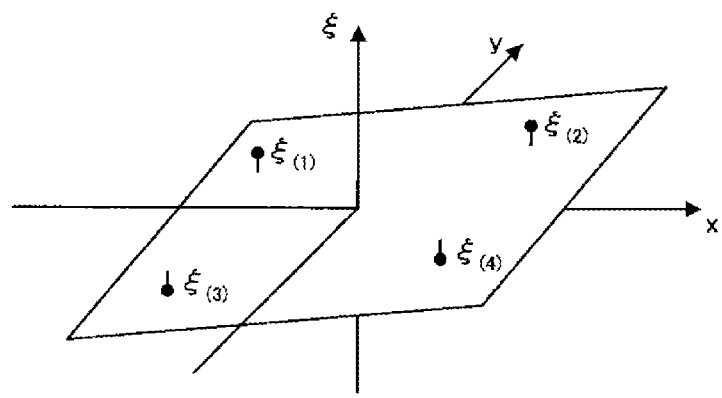
FIG. 9 is an illustration for explanation of orientation control in a communication device, according to an exemplary embodiment of the present invention.

FIG. 9 illustrates a block diagram for explaining orientation control in the communication device 100, according to an exemplary embodiment of the present invention. Referring to FIG. 9, an example of relationships among the amount of phase rotation extracted by the phase extractor 160, the amount of phase rotation estimated by the phase plane estimator 162, and the coordinate of a sub-array center is illustrated. A slope of a plane shown in FIG. 9 equals to an estimated amount of phase rotation.

The estimated amount of phase rotation in the phase plane estimator 162 may be represented, for example, by Equation 9. Also, relationships among the amount of phase rotation extracted by the phase extractor 160, the amount of phase rotation estimated by the phase plane estimator 162, and the coordinate of a sub-array center may be represented by Equation 10.

MathFigure 9

$$e_u = [e_u^{(x)}, e_u^{(y)}]^T \qquad [Math.9]$$

MathFigure 10

$$\begin{bmatrix} \xi_u(1) \\ \xi_u(2) \\ \vdots \\ \xi_u(N) \end{bmatrix} = \begin{bmatrix} a_x(1) & a_y(1) \\ a_x(2) & a_y(2) \\ \vdots & \vdots \\ a_x(N) & a_y(N) \end{bmatrix} \begin{bmatrix} e_u^{(x)} \\ e_u^{(y)} \end{bmatrix}. \qquad [Math.\ 10]$$

Denoting Equation 10 in a vector, the relationships among the amount of phase rotation extracted by the phase extractor 160, the amount of phase rotation estimated by the phase plane estimator 162, and the coordinate of a sub-array center may be substituted by Equation 11.

MathFigure 11

$$\xi_u = Ae_u \qquad [Math.11]$$

Using the least squares method, amounts of phase rotation of azimuth and elevation angles are calculated by operation represented in Equation 12. In other words, the phase plane estimator 162 estimates a phase error by performing the operation as represented in Equation 12.

MathFigure 12

$$e_u = (A^T A)^{-1} A^T \xi_u \qquad [Math.12]$$

With the phase plane estimator 162, the direction error estimator 134 may estimate a phase error based on detected phase error components for each sub-array.

The azimuth/elevation error converter 164 converts the amounts of phase rotation of the azimuth and elevation angles calculated by the phase plane estimator 162 to an azimuth error and an elevation error (direction error).

More specifically, assuming that (azimuth, elevation) of a beam is currently set as (θu, φu), the azimuth/elevation error converter 164 converts the amounts of phase rotation of the azimuth and elevation angles calculated by the phase plane estimator 162 to the azimuth error and the elevation error by an operation represented by Equation 13. Δφ^u denotes the azimuth error and Δϕ^u denotes the elevation error.

MathFigure 13

$$\begin{cases} \Delta \hat{\theta}_u = e_u^{(x)}/2\pi \cos\theta_u \\ \Delta \hat{\varphi}_u = e_u^{(y)}/2\pi \cos\varphi_u \end{cases} \qquad [Math.\ 13]$$

The azimuth/elevation updater 166 re-sets the direction of orientation of the phased array antenna based on the azimuth error and the elevation error calculated by the azimuth/elevation error converter 164.

More specifically, the azimuth/elevation updater 166 refreshes azimuth and elevation angles that define orientation of the phased array antenna 102 by an operation represented by Equation 14. Refreshed azimuth and elevation angles are used in the signal converter 106 as the orientation of a beam in the next time slot.

MathFigure 14

$$\begin{cases} \theta_u = \theta_u + \Delta\hat{\theta}_u \\ \varphi_u = \varphi_u + \Delta\hat{\varphi}_u \end{cases} \quad [\text{Math. 14}]$$

In other embodiments, other operations than the operation represented by Equation 14 may also be used to refresh azimuth and elevation angles that define orientation of the phased array antenna 102. For example, the azimuth/elevation updater 166 may refresh azimuth and elevation angles that define orientation of the phased array antenna 102 by an operation represented by Equation 15 using a step-size parameter "μ" related to an adaptive algorithm.

MathFigure 15

$$\begin{cases} \theta_u = \theta_u + \mu \cdot \Delta\hat{\theta}_u \\ \varphi_u = \varphi_u + \mu \cdot \Delta\hat{\varphi}_u \end{cases} \quad [\text{Math. 15}]$$

The step size parameter "μ" may be a fixed value, for example, μ=0.1, or may not be a fixed value. For example, the azimuth/elevation updater 166 may gradually decrease the value of the step-size parameter "μ" from its initial value.

The azimuth/elevation updater 166 may use the step-size parameter "μ to refresh azimuth and elevation angles that define the direction of orientation of the phased array antenna 102, thereby enabling the communication device 100 to reduce affection of noise.

With the azimuth/elevation error converter 164 and the azimuth/elevation updater 166, the orientation setting unit 136 may re-set the direction of orientation of the phased array antenna 102 based on a direction error between an arrival direction of the received signal and the set direction of the orientation of the phased array antenna 102 converted from the phase error estimated by the direction error estimator 134. Although it is illustrated above that the azimuth/elevation error converter 164 constitutes the orientation setting unit 136, the azimuth/elevation error converter 164 may constitute the direction error estimator 134 in the orientation controller 10.

In the communication device 100, orientation of the phased array antenna 102 is controlled by the above orientation control in the orientation controller 110.

[2-3] Effect of Orientation Control in the Communication Device 100 of an Embodiment of the Present Invention An example of an effect of the orientation control in the communication device 100 will now be described.

Figure 10:
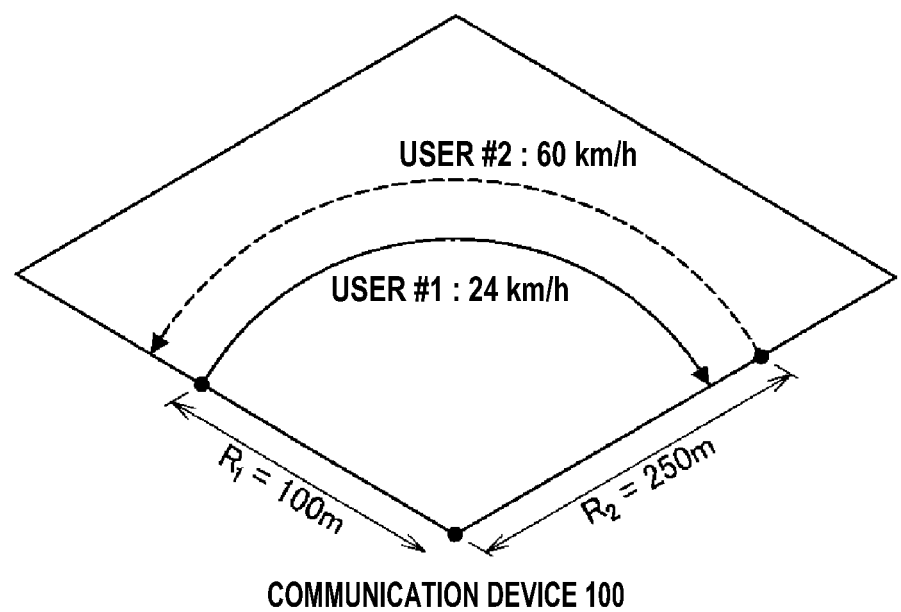
FIG. 10 is an illustration for explanation of effects of orientation control in a communication device, according to an exemplary embodiment of the present invention.
Figure 11:
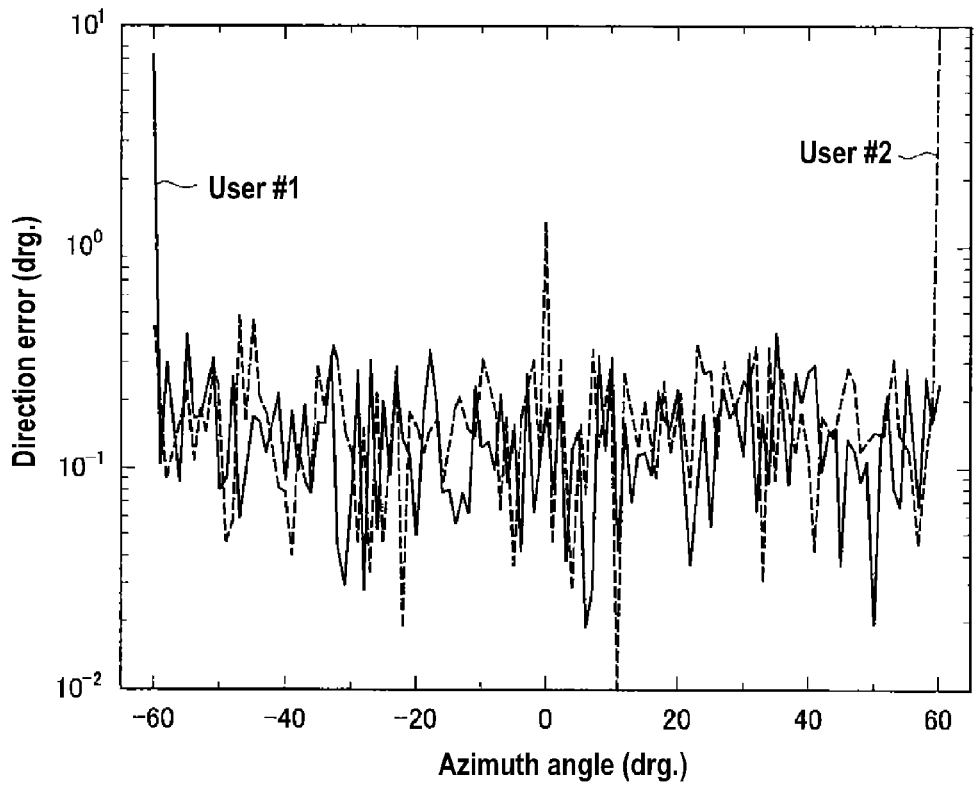
FIG. 11 is another illustration for explanation of effects of orientation control in a communication device, according to an exemplary embodiment of the present invention.

FIGS. 10 and 11 are illustrations to explain effects of the orientation control in the communication device 100, according to exemplary embodiments of the present invention. FIG. 10 illustrates a moving model of transmitting devices 200A and 200B, and FIG. 11 illustrates an example of direction error results for the moving model of FIG. 10. In FIGS. 10 and 11, the transmitting device 200A is denoted as User #1 and the transmitting device 200B is denoted as User #2.

In the moving model of FIG. 10, User #1 moves along an arc which is 100 M away from the communication device 100, starting from an edge of a sector at 24 Km/h, and User #2 moves along an arc which is 250 M away from the communication device 100, starting from an edge of the sector at 60 Km/h. Let the average SNR for reception of signals from User #1 at each antenna element of the phased array antenna 102 of the communication device 100 be −4.5 dB, and the average SNR for reception of signals from User #2 at each antenna element be −12.4 dB.

In case of representing the direction error "e" in Equation 16, using the direction error "Δθ" and the elevation error "Δφ", the direction error "e" of User #1 and the direction error "e" of User #2 result in what are shown in FIG. 11.

MathFigure 16

$$e = \sqrt{(\Delta\theta)^2 + (\Delta\varphi)^2} \quad [\text{Math.16}]$$

As shown in FIG. 11, as the communication device 100 performs the orientation control, direction errors are quickly tracked along each user's movements and converged in each user's direction. In FIG. 11, the direction error is suppressed below 0.5 degrees in all directions except 0-degree direction at which User #1 and User #2 are located in the same orientation.

Accordingly, by performing the orientation control, the communication device 100 may realize good orientation control characteristics for a plurality of users (transmitting devices 200), thus facilitating improvement of accuracy of the orientation control. The orientation control method of exemplary embodiments of the present invention may be appropriate for orientation control for multi users.

[2-4]

As described above, the communication device 100 includes conversion circuits 112A, 112B, . . . , 112n for sub-arrays, respectively, the sub-arrays being grouped from a plurality of antenna elements of the phased array antenna 102, as shown in FIG. 6. Thus the communication device 10 may only need to have a series of the low-pass filter 114, the A/D converter 116, and the FFT circuit 118 for each sub-array, as show in FIG. 6.

Therefore, compared with the conventional device as shown in FIG. 1, the communication device 100 may reduce the scale of the circuit related to processing the signal received through the phased-array antenna.

The communication device 100 also performs orientation control as follows:

(1) orientation control that uses a correctly decoded signal of a resource block (for example, a signal of a resource block that includes both correctly decoded playback data (a data signal) and a reference signal, or a signal of a resource block having better reception condition)

(2) orientation control that prevents accuracy degradation due to affection of a signal transmitted from any other transmitting device by reducing inter-beam interference due to the signal transmitted from any other transmitting device beforehand.

(3) orientation control based on an amount of phase shift (phase error) between sub-arrays by generating a replica signal of a desired signal at an array center of the phased array antenna 102 as a reference signal for the orientation control (4) orientation control based on an estimated amount of phase shift (direction error) between sub-arrays, the amount of phase shift being estimated to have good accuracy using, for example, the least squares method.

With the orientation control using a correctly decoded resource block as indicated by (1), the communication device 100 may track down the direction of orientation of the moving transmitting device 200. Furthermore, with the orientation control according to one or more of (2) to (4), the communication device 100 may further improve characteristics of orientation control.

Thus, by performing the orientation control according to the exemplary embodiments of the present invention, the communication device 100 may achieve better orientation control characteristics as shown in FIG. 11 and may improve accuracy of the orientation control compared with the conventional communication device as shown in FIG. 2.

The communication device 100 may attempt to improve accuracy of the orientation control while holding down increase in the scale of the circuit related to processing signals received through the phased array antenna 102.

(Orientation Control Method of an Embodiment of the Present Invention)

An example of an orientation control method according to an embodiment of the present invention will now be described.

Figure 12:
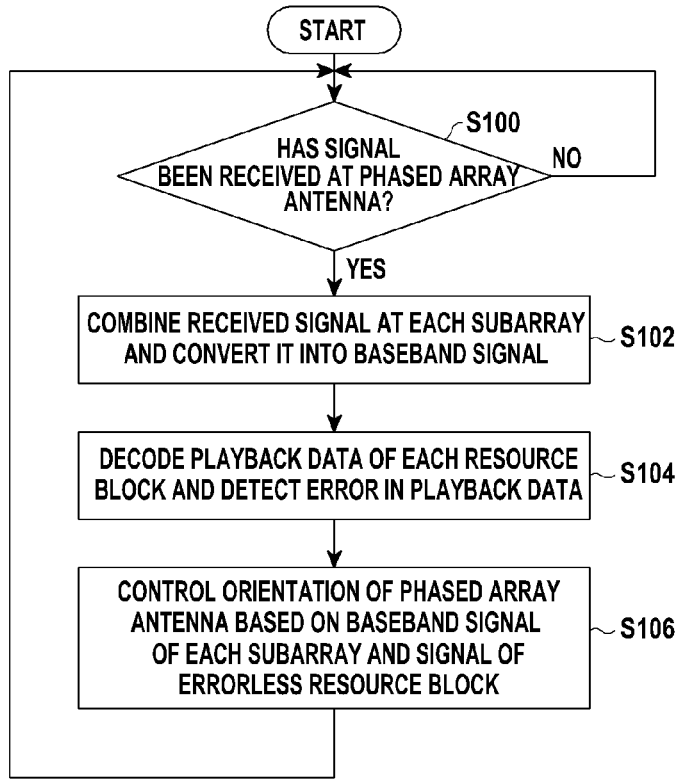
FIG. 12 is a flowchart illustrating an orientation control method, according to an exemplary embodiment of the present invention.

FIG. 12 is a flowchart illustrating an example of an orientation control method, according to an exemplary embodiment of the present invention. In the embodiment, the communication device 10 is involved in the orientation control method. The orientation control method may be applied to any other communication device including a plurality of antenna elements arranged on a plane and a phased array antenna to receive signals from one or more transmitting devices, or a communication device connected to the phased array antenna.

The communication device 100 determines whether a signal transmitted from a transmitting device has been received through the phased array antenna, in step S100. For example, having received a signal through an antenna element of the phased array antenna, the communication device 100 determines that a signal has received.

Having determined that no signal has been received in step S100, the communication device 100 stop proceeding the process until determining that a signal has been received.

Otherwise, having determined that a signal has been received in step S100, the communication device 10 combines signals received through antenna elements for each sub-array grouped from a plurality of antenna elements that forms the phased array antenna and converts the combined signal to a baseband signal for each sub-array, in step S102. The signal converter 106 shown in FIG. 6 may be involved in performing the step S102.

The communication device 100 decodes playback data based on respective baseband signals for sub-arrays in each resource block, and detects an error of the decoded playback data, in step S104. The signal processor 108 shown in FIG. 6 may be involved in performing the step S104.

The communication device 100 controls orientation of the phased array antenna based on a baseband signal for each sub-array and a signal of a resource block whose playback data has no error, in step S106. The communication device 100 repeats this process from step S100. The orientation controller 110 shown in FIG. 6 may be involved in performing the step S106.

The communication device 100 controls orientation of the phased array antenna by performing the process of FIG. 12.

Since the communication device 100 combines received signals of sub-arrays and converts the combined signal to a baseband signal, in step S102, it just needs to have a series of the low-pass filter 114, the A/D converter 116, and the FFT circuit 118 for each sub-array, as show in FIG. 6. Thus, for example, in processing what are shown in FIG. 12, the communication device 100 may reduce the scale of a circuit related to processing signals received through the phased array antenna 102, as compared with the conventional communication device as shown in FIG. 1.

Since the communication device 100 performs in step S106 the orientation control using a correctly decoded signal of a resource block (for example, a signal of a resource block that contains both of correctly decoded playback data (a data signal) and a reference signal, or a signal of a resource block having better reception condition), it may improve accuracy of the orientation control as compared with the conventional communication device as shown in FIG. 2.

Therefore, by performing what is shown in FIG. 12, the communication device 100 may improve accuracy of the orientation control while holding down increase in the scale of the circuit related to processing signals received through the phased array antenna 102.

Although the communication device was illustrated in the above embodiments, the present invention is not limited to the form of the communication device. Those embodiments of the present invention may be applied to various devices, such as a device serving as a base station, a device serving as a wireless access point, etc. The embodiments of the present invention may be implemented by a signal processing integrated circuits that may be embedded into such devices.

<Programs of an Embodiment of the Present Invention>

Programs when executed by a computer equipped with a phased array antenna to cause the computer to serve as the communication device of the present invention (for example, programs that enable processing related to the orientation control method of the present invention) may hold down the scale of a circuit related to processing signals received through the phased array antenna while improving accuracy of the orientation control.

Although the embodiments of the present invention are described with reference to accompanying drawings, it may be appreciated that the present invention is not limited thereto. The skilled in the art will appreciate that various modifications or variations may be made within the scope of the appended claims.

For example, embodiments of the present invention may include a recording medium having the computer program stored thereon.

Several embodiments have been described in connection with, for example, portable terminals, but it will be understood that various modifications can be made without departing the scope of the present invention. Thus, it will be apparent to those ordinary skilled in the art that the invention is not limited to the embodiments described, but can encompass not only the appended claims but the equivalents.

The invention claimed is:

1. A communication device comprising:
    a phased array antenna comprising a plurality of antenna elements arranged on a plane configured to receive signals transmitted from one or more transmitting devices;
    a signal converter configured to combine signals received through antenna elements for each sub-array and convert the combined signal for each sub-array into a baseband signal, wherein each of the sub-arrays is grouped from the plurality of antenna elements;
    a signal processor configured to decode playback data based on respective baseband signals for sub-arrays in each resource block and detect an error of the decoded playback data; and
    an orientation controller configured to control orientation of the phased array antenna based on the base band signals for the sub-arrays and a signal of a resource block with the playback data comprising no error.

2. The communication device of claim 1, wherein the orientation controller comprises:
    a resource block selector configured to select a resource block with the playback data comprising no error,
    a resource block reproducer configured to reproduce a signal of the selected resource block, a reference signal generator configured to generate a reference signal to be used as a basis in orientation control based on the reproduced signal of the resource block, a direction error estimator configured to estimate an error in a direction toward the orientation based on the baseband signals of the sub-arrays and the reference signal, and an orientation setting unit configured to set a direction of orientation of the phased array antenna based on the estimated error.

3. The communication device of claim 2, wherein the resource block selector is configured to select from among resource blocks with the playback data comprising no error, wherein a resource block comprises a selection of a combination of a high transmission rate of modulation and encoding, wherein the resource block also comprises no second playback data for a second signal transmitted from any other transmitting device than the transmitting device that transmits a first signal that corresponds to the playback data, and wherein the resource block is configured to receive the first signal and the second signal at the same time through the phased array antenna, or the resource block comprises a selection of a combination of a high transmission rate of modulation and encoding, wherein the resource block comprises second playback data with no error for a second signal transmitted from any other transmitting device simultaneously with a first signal that corresponds to the playback data through the phased array antenna.

4. The communication device of claim 3, wherein the direction error estimator is configured to:

generate a replica interference signal equivalent to an interference signal indicative of interference of a signal transmitted from any other transmitting device with a baseband signal for each of the sub-arrays, based on a channel estimation value from the signal transmitted from the any other transmitting device and based on a signal of a resource block that corresponds to the signal transmitted from the any other transmitting device, and eliminate components of the replica interference signal from each baseband signal for each sub-array based on the received signal.

5. The communication device of claim 4, wherein the reference signal generator is configured to:

generate a replica baseband signal for each sub-array which is equivalent to a baseband signal for the sub-array, wherein the replica baseband signal for each sub-array is generated based on a signal of a resource block reproduced in the resource block reproducer and based on an estimation value of a re-estimated channel, and wherein the estimation value of the re-estimated channel is based on a baseband signal for each sub-array from which components of the replica interference signal are eliminated and the signal of the resource block, and combine replica baseband signals for the sub-arrays and generate the reference signal.

6. The communication device of claim 4, wherein the direction error estimator is configured to:

detect a phase error component for each sub-array based on a correlation of a baseband signal for the sub-array from which the replica interference signal is eliminated and the reference signal, estimate a phase error based on the detected phase error component for the sub-array, and re-set a direction of an orientation of the phased array antenna based on a direction error between arrival direction of the received signal and a set direction of orientation of the phased array antenna which is converted from the estimated phase error.

7. The communication device of claim 6, wherein the direction error estimator is configured to estimate the phase error using the least squares method.

8. The communication device of claim 5, wherein the direction error estimator is configured to:

detect a phase error component for each sub-array based on a correlation of a baseband signal for the sub-array from which the replica interference signal is eliminated and the reference signal, estimate a phase error based on the detected phase error component for the sub-array, and re-set a direction of an orientation of the phased array antenna based on a direction error between arrival direction of the received signal and a set direction of orientation of the phased array antenna which is converted from the estimated phase error.

9. The communication device of claim 1, further comprising a correlator is configured to perform the correlation of the baseband signal for the sub-array from which the replica interference signal is eliminated.

10. The communication device of claim 9, further comprising a phase extractor configured to extract a phase error component for each sub-array based on the correlation.

11. An orientation control method in a communication device that comprises a phased array antenna including a plurality of antenna elements arranged on a plane for receiving signals from one or more transmitting devices, the method comprising:

combining signals received through antenna elements for each sub-array and converting the combined signal for each sub-array into a baseband signal, wherein each of the sub-arrays are grouped from the plurality of antenna elements;

decoding playback data based on respective baseband signals for sub-arrays in each resource block and detecting an error of the decoded playback data; and controlling orientation of the phased array antenna based on the base band signals for the sub-arrays and a signal of a resource block with the playback data comprising no error.

12. The method of claim 11, further comprising:

selecting, by a resource block selector, a resource block with the playback data comprising no error, reproducing, by resource block reproducer, a signal of the selected resource block, generating, by a reference signal generator, a reference signal to be used as a basis in orientation control based on the reproduced signal of the resource block, estimating, by a direction error estimator, an error in a direction toward the orientation based on the baseband signals of the sub-arrays and the reference signal, and setting, by an orientation setting unit, a direction of orientation of the phased array antenna based on the estimated error.

13. The method of claim 12, wherein selecting, by the resource block selector comprises selecting from among resource blocks with the playback data comprising no error, wherein a resource block comprises a selection of a combination of a high transmission rate of modulation and encoding, wherein the resource block also comprises no second playback data for a second signal transmitted from any other transmitting device than the transmitting device that transmits a first signal that corresponds to the playback data, and wherein the resource block receives the first signal and the second signal at the same time through the phased array antenna, or wherein the resource block comprises a selection of a combination of a high transmission rate of modulation and encoding, wherein the resource block second playback data with no error for a second signal transmitted from any other transmitting device simultaneously with a first signal that corresponds to the playback data through the phased array antenna.

14. The method of claim 13, further comprising:

generating, by the direction error estimator, a replica interference signal equivalent to an interference signal indicative of interference of a signal transmitted from any other transmitting device with a baseband signal for each of the sub-arrays, based on a channel estimation value from the signal transmitted from the any other transmitting device and based on a signal of a resource block that corresponds to the signal transmitted from the any other transmitting device, and eliminating, by the direction error estimator, components of the replica interference signal from each baseband signal for each sub-array based on the received signal.

15. The method of claim 14, further comprising:

generating, by the reference signal generator, a replica baseband signal for each sub-array which is equivalent to a baseband signal for the sub-array, wherein the replica baseband signal for each sub-array is generated based on a signal of a resource block reproduced in the resource block reproducer and based on an estimation value of a re-estimated channel, and wherein the estimation value of the re-estimated channel is based on a baseband signal for each sub-array from which components of the replica interference signal are eliminated and the signal of the resource block, and combining, by the reference signal generator, replica baseband signals for the sub-arrays and generating, by the reference signal generator, the reference signal.

16. The method of claim 14, further comprising:

detecting, by the direction error estimator, a phase error component for each sub-array based on a correlation of a baseband signal for the sub-array from which the replica interference signal is eliminated and the reference signal, estimating, by the direction error estimator, a phase error based on the detected phase error component for the sub-array, and re-setting, by the direction error estimator, a direction of an orientation of the phased array antenna based on a direction error between arrival direction of the received signal and a set direction of orientation of the phased array antenna which is converted from the estimated phase error.

17. The method of claim 15, further comprising:

detecting, by the direction error estimator, a phase error component for each sub-array based on a correlation of a baseband signal for the sub-array from which the replica interference signal is eliminated and the reference signal, estimating, by the direction error estimator, a phase error based on the detected phase error component for the sub-array, and re-setting, by the direction error estimator, a direction of an orientation of the phased array antenna based on a direction error between arrival direction of the received signal and a set direction of orientation of the phased array antenna which is converted from the estimated phase error.

18. The method of claim 17, further comprising, estimating, by the direction error estimator, the phase error using the least squares method.

19. The method of claim 11, further comprising performing, by a correlator, the correlation of the baseband signal for the sub-array from which the replica interference signal is eliminated.

20. The method of claim 19, further comprising, extracting, by a phase extractor, a phase error component for each sub-array based on the correlation.

* * * * *